United States Patent
Zangi

[11] Patent Number: 6,005,900
[45] Date of Patent: Dec. 21, 1999

[54] WIDEBAND CHANNELIZATION USING SUBSAMPLED DISCRETE FOURIER TRANSFORMS

[75] Inventor: Kambiz C. Zangi, Raleigh, N.C.

[73] Assignee: Ericsson Inc., Research Triangle Park, N.C.

[21] Appl. No.: 08/921,186

[22] Filed: Aug. 29, 1997

[51] Int. Cl.[6] .................................................. H04B 1/10
[52] U.S. Cl. ...................... 375/350; 375/316; 370/210; 708/405
[58] Field of Search ................................... 375/270, 277, 375/316, 321, 350, 355; 370/210; 708/401, 404, 405

[56] References Cited

U.S. PATENT DOCUMENTS

| | | | |
|---|---|---|---|
| 4,131,766 | 12/1978 | Narasimha | 370/484 |
| 5,293,382 | 3/1994 | Carson et al. | 370/210 |
| 5,323,391 | 6/1994 | Harrison | 370/210 |
| 5,396,489 | 3/1995 | Harrison | 370/210 |
| 5,519,692 | 5/1996 | Hershey et al. | 370/210 |
| 5,537,435 | 7/1996 | Carney et al. | 375/219 |
| 5,606,575 | 2/1997 | Williams | 375/219 |
| 5,629,929 | 5/1997 | Blanchard et al. | 370/210 |

OTHER PUBLICATIONS

Kovacevic, et al.; "*Perfect Reconstruction Filter Banks With Rational Sampling Factors*"; IEEE Transactions on Signal Processing, vol. 41, No. 6, Jun. 1, 1993, pp. 2047–2066, XP000377587.

*Primary Examiner*—Young T. Tse
*Attorney, Agent, or Firm*—Jenkens & Gilchrist, P.C.

[57] ABSTRACT

A receiver and channelizer for processing a wideband signal is disclosed. The channelizer consists of a receiver for receiving a wideband signal. The received wideband signal is processed by a subsampled DFT-channelizer to extract a selected number of regularly spaced channels from a plurality of channels within the received wideband signal. These extracted regularly spaced channels are then output for further processing by a receiver.

10 Claims, 3 Drawing Sheets

WIDEBAND CHANNELIZATION USING SUBSAMPLED DISCRETE FOURIER TRANSFORMS

BACKGROUND OF THE INVENTION

1. Technical Field of the Invention

The present invention relates to wideband channelization techniques, and more particularly, to a method for using subsampled discrete fourier transform filter banks to channelize wideband signals.

2. Description of Related Art

Radio receivers requiring simultaneous reception of multiple radio channels require the extraction of a number of radio channels from a wideband signal. Such receivers may include macro base stations, micro base stations, pico base stations and others. These types of receivers typically operate according to a frequency reuse plan that effectively restricts each base station to a regularly spaced subset of all available channels.

In one prior art implementation, individual radio channels are extracted from a wideband signal utilizing a DFT (discrete fourier transform) filter bank. The problem with existing DFT-channelizers is that they extract every channel from the wideband radio signal. This requires a great deal of arithmetic operations by the channelizer and increases the cost/complexity of the receiver. Since each base station is only utilizing a regularly spaced subset of all available channels. Accordingly, a more efficient, less complex method for extracting radio channels from a wideband signal is desired.

SUMMARY OF THE INVENTION

The present invention overcomes the foregoing and other problems with a channelizer for use in processing a wideband signal within a receiver. A wideband signal is initially processed by a subsampled filter bank to extract a selected number of regularly spaced channels from the plurality of channels within the received wideband signal. The subsampled DFT-channelizer consists of a bank of polyphase filters for extracting all of the potential channels from the wideband signal (M channels in all). The outputs of the polyphase filters are then time aliased to generate a second sequence of signals equal in number to the selected number of regularly spaced channels M/L desired channels).

This second sequence of signals are processed by an $$\frac{M}{L}\text{-point}$$

inverse discrete fourier transform resulting in M/L bandpass signals. The inverse discrete fourier transform coefficients are then mixed with a sequence of carrier signals to shift these bandpass signals to baseband, resulting in extraction of M/L regularly spaced channels from the wideband signal. This system significantly decreases the amount of required processing power. In the system in accordance with the present invention, the number of arithmetic operations necessary to produce the desired channels are significantly less than the number of arithmetic operations presently required to extract every channel.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
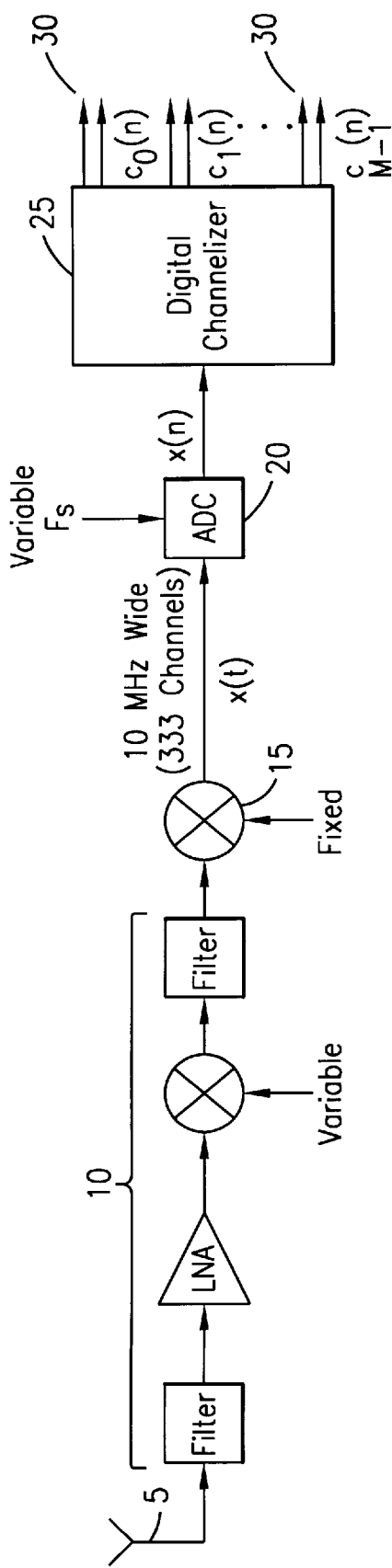
FIG. 1 is a block diagram of a generic wideband receiver.
Figure 3:
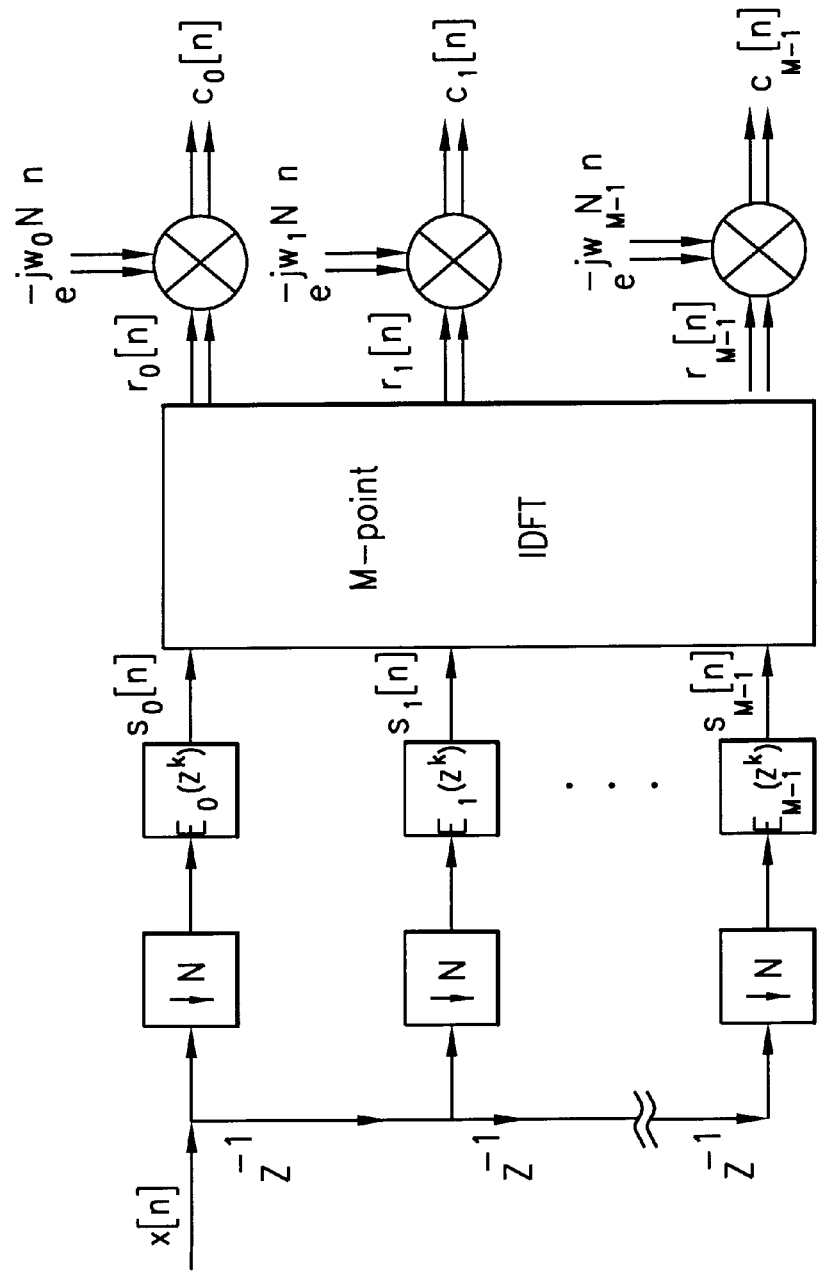
FIG. 3 is a diagram of a DFT-channelizer.

Referring now to the drawings, and more particularly to FIG. 1, there is illustrated a block diagram of a generic wideband receiver. A transmitted wideband signal is received at an antenna 5. Through several stages of mixing and filtering (shown generally at 10), the signal is processed to a desired frequency band, and is then mixed down by a mixer 15 to a baseband signal x(t) with relatively wide bandwidth for input to a wideband analog-to-digital converter 20. The analog-to-digital converter 20 converts the analog wideband signal x(t) to a digital wideband signal x(n) which is then processed by a digital channelizer 25 to extract the various radio channels 30. The prior art DFT-channelizer 25 (as shown in FIG. 3) provides a computationally efficient manner for extracting every channel within the wideband signal x(n).

Figure 2:
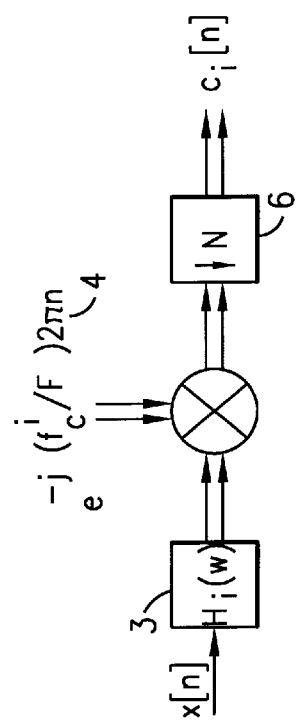
FIG. 2 is a functional diagram of a single branch of a DFT-channelizer.

Referring now to FIG. 2, there is illustrated a functional diagram of one branch of a DFT-channelizer $H_o(w)$ represents a real, lowpass FIR filter. Every other filter within the filter bank is a modulated version of this lowpass prototype. Thus, $$H_i(w) = H_i\left(w - \frac{2\pi}{M}i\right);$$

$0 \leq i \leq M-1$, M equals the number of channels. Note that $H_i(w)$ represents a bandpass complex-valued filter centered on the discrete time frequency $$\frac{2\pi}{M}i,$$

or equivalently centered around the continuous time frequency $$\frac{F_s}{M}i$$

($F_s$ is the sampling frequency of the A/D converter), M equals the total number of channels between $\{-F_s/2, +F_s/2\}$). In other words there are exactly M equal bandwidth filters in the filter bank, spaced apart by $$f_{cs} = \frac{F_s}{M}.$$

The DFT-channelizer of FIG. 3 is valid only when M is an integer multiple of the downsampling factor N (i.e., M=N× K; where K is some positive integer). The DFT-channelizer can be efficiently implemented using an inverse discrete fourier transform (IDFT) and the polyphase decomposition of the lowpass prototype filter $H_o(n)$. This implementation is typically referred to as a DFT-channelizer and is illustrated in FIG. 3.

$$r_k[n] = \sum_{i=0}^{M-1} S_i[n] e^{j\frac{2\pi}{M}ki}; 0 \le K \le M-1$$

Referring now to FIG. 3, there is illustrated a block diagram of a DFT-channelizer. In FIG. 3, the $E_i(z)$s represent the polyphase components of $H_o(z)$. Thus, $$H_i(z) = \sum_{i=o}^{m-i} z^{-i} E_i(z^m)$$

where: $e_i(n) = h_i[nM + i] \quad o \le i \le M-1$

The main limitation of a prior art DFT-channelizer is that it channelizes every channel in the frequency range $$\left\{-\frac{F_s}{2}, \frac{F_s}{2}\right\};$$

even though only a subset of these channels might actually be needed. For example, in most cellular systems using a 7/21 frequency reuse plan, each base station only uses one out of every seven radio channels. Thus, a receiver would only need to channelize every 7th channel.

Figure 4:
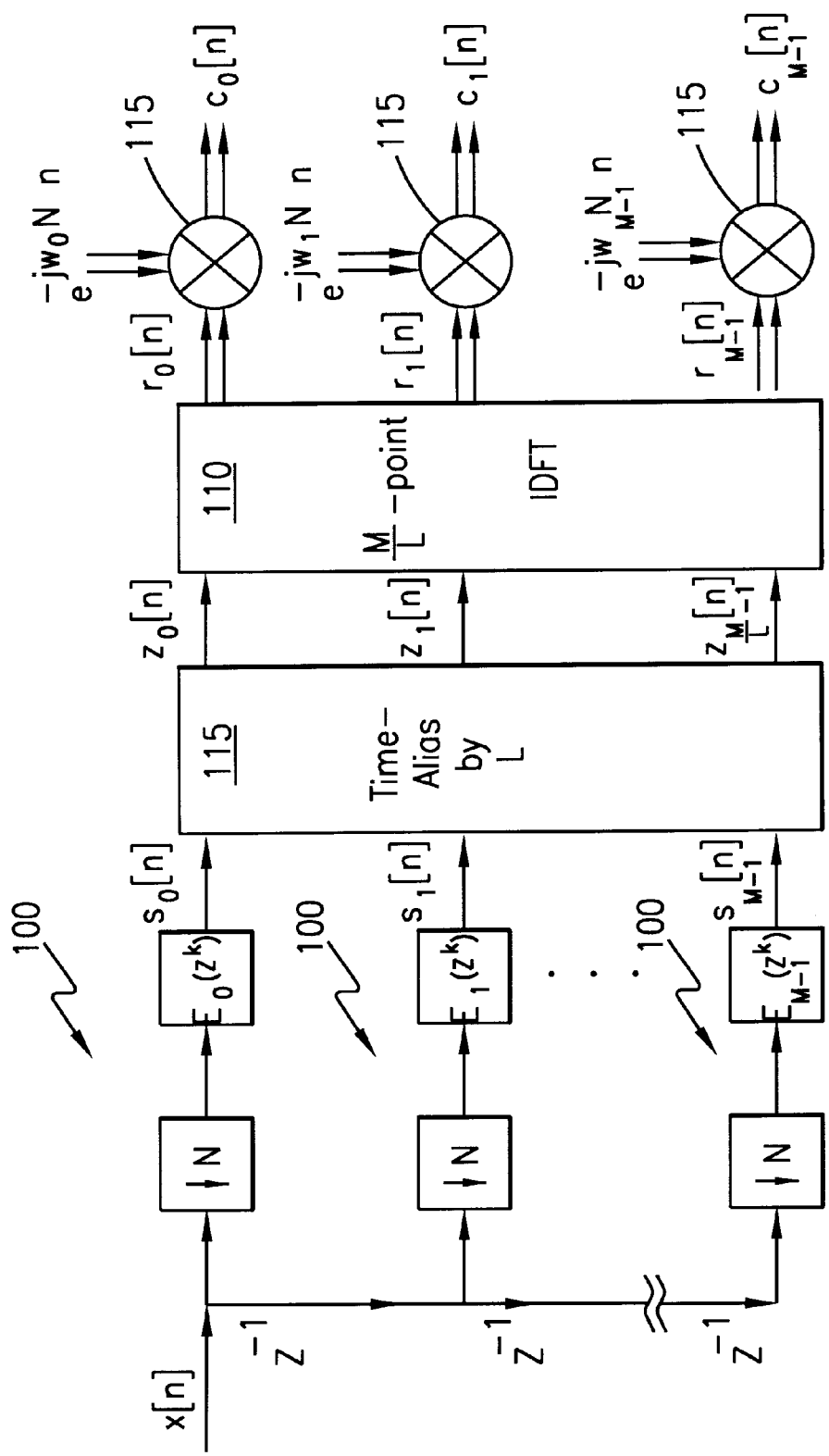
FIG. 4 is a block diagram of a subsampled DFT-channelizer.

Referring now to FIG. 4, there is illustrated a block diagram of a subsampled DFT-channelizer of the present invention. For the subsampled DFT-channelizer, it is assumed that only every L-th output channel must be computed and that the total number of channels M is an integer multiple of L, thus $$M = L \times r$$

where r is some positive integer.

From the discrete wideband signal x(n), the subsampled DFT-channelizer computes only the desired channels $\{c_o[n], c_L[n], c_{2L}[n], \ldots, c_{M-L}[n]\}$.

Comparing FIG. 4 to FIG. 3, we see that the subsampled DFT-channelizer replaces the M-point DFT in the DFT-channelizer with a time-aliasing block and an $$\frac{M}{L}\text{-point}$$

IDFT. The combined complexity of the time-aliasing block and $$\frac{M}{L}\text{-point}$$

IDFT is much smaller than the complexity of the M-point IDFT.

The outputs of the time-aliasing block are formed from the output of the polyphase filters according to $$z_i[n] = \sum_{r=o}^{L-1} s_{i-Qr}[n] \quad o \le i \le Q-1$$

where $Q = \frac{M}{L}$; and $$r_{KL} = \sum_{i=o}^{M-1} Z_i[n] e^{j\frac{2\pi}{Q}Ki}; o \le K \le Q-1$$

The Q outputs of the $$\frac{M}{L}\text{-point}$$

IDFT in the subsampled DFT channelizer of FIG. 4 are $\{r_o[n], r_L[n], r_{2L}[n], \ldots, r_{m-L}[n]\}$, (i.e., every L-th output of IDFT block in FIG. 3).

Similarly, the final outputs of the subsampled DFT-channelizer in FIG. 4 are $\{c_o[n], c_L[n], c_{2L}[n], \ldots, c_{m-L}[n]\}$, (i.e., every L-th final output of the DFT-channelizer in FIG. 3).

For example, let us consider an analog signal x(n) of approximately 10 MHz of bandwidth, and let us assume that each radio channel conforms to the D-AMPS standard. Specifically, the channel spacing is $f_{cs}=30$ KHz. Furthermore, let us assume that a 7/21 frequency reuse pattern is used. Hence, only every 7th channel needs to be extracted from x(n), i.e. L=7.

The full DFT-channelizer of FIG. 3 can be used to extract every 30 KHz band in x(n) if the sampling frequency of A/D converter is set at $F_s=34.02$ MHz. In this case the total number of channels is $$M = \frac{34.02 \text{ MHZ}}{30 \text{ KHZ}} = 1134.$$

An IDFT of size 1134 needs to be implemented by the DFT-channelizer every $$\frac{F_s}{N}$$

seconds. Since 1134 is a highly composite number, a Dooley-Tukey FFT algorithm can be used to compute this IDFT efficiently.

Alternatively, the subsampled DFT-channelizer of FIG. 4 can be used to extract only every 7th channel from x(n) (i.e., L=7 if the sampling frequency of the A/D converter is set at $F_s=34.02$ MHz. In this case, a 162-point IDFT needs to be implemented by the subsampled DFT-channelizer every $$\frac{F_s}{N}$$

(since M/L=1134/7=162). The complexity of a 1134-point IDFT is about 7 times the complexity of a 162 point IDFT.

Referring now back to FIG. 4, the discrete wideband signal x[n] is sampled and filtered by the bank of polyphase filters 100 to generate the sequence $s_i[n]$. Each branch of the $s_i[n]$ signal is time aliased by L at 105 to generate a new sequence $z_i[n]$.

$$\frac{M}{L}\text{-point}$$

IDFT 110 is taken of the sequence $z_i[n]$ to yield the sequence $r_i[n]$. This sequence is mixed with carrier signal sequence $e^{jWrNn}$; where $$W_r = \frac{2\pi}{Q} \times r$$

at mixer 115 to yield the selected channels from the wideband signal.

The $\frac{M}{L}$-point IDFT in the subsampled DFT-channelizer can be computed using any known fast algorithm for computing DFT/IDFT. These algorithms include the radix-2 FFT algorithm, the Cooley-Tukey FFT algorithm, the Wionogard prime-length FFT algorithm, and the prime-factor FFT algorithm. Depending on the exact value of M/L, a particular algorithm for computation of the IDFT might be more efficient. Hence, the free parameters of the subsampled DFT-channelizer (e.g., $F_s$ and M) can be chosen such that the resulting IDFT can be computed more efficiently using a particular FFT/IFFT algorithm. In other words, these parameters can be chosen to get an IDFT size that can be computed efficiently.

For example, if M/L is a highly composite number, the Cooley-Tukey FFT algorithm can be used to efficiently compute the resulting IDFT. On the other hand, if M/L is a prime number, the Winograd prime-length FFT algorithm can be used to efficiently compute the resulting IDFT. Finally, if M/L is a power of four, the radix-4 FFT algorithm can be used to efficiently compute the resulting IDFT.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the following claims.

What is claimed is:

1. A receiver, comprising:
   first circuitry for converting a received signal to an analog baseband signal;
   an analog to digital converter for converting the analog baseband signal to a digital baseband signal; and
   a subsampled DFT-channelizer for extracting a plurality of selected, regularly spaced channels from the digital baseband signal, comprising:
   a plurality of polyphase filters for extracting a first sequence of signals;
   second circuitry for time aliasing the first sequence of signals to generate a second sequence of signals;
   an $\frac{M}{L}$-point inverse discrete fourier transform for calculating IDFT coefficients for the plurality of selected, regularly spaced channels from the second sequence of signals; and
   a combiner for combining the IDFT coefficients with a carrier signal sequence to provide the plurality of selected, regularly spaced channels.

2. The receiver of claim 1 wherein the first sequence of signals includes each channel within the digital baseband signal.

3. The receiver of claim 1 wherein the second sequence of signals includes only a number of signals equal to the plurality of selected, regularly spaced channels.

4. The receiver of claim 1 wherein the subsampled DFT-channelizer can extract any first channel from the digital baseband signal as one of the plurality of selected, regularly spaced channels.

5. A channelizer for processing a wideband signal comprising:
   an input for receiving the wideband signal;
   a subsampled DFT-channelizer for extracting a number of selected, regularly spaced channels from a plurality of channels within the received wideband signal, comprising:
   a plurality of polyphase filters for extracting a first sequence of signals;
   a circuitry for time aliasing the first sequence of signals to generate a second sequence of signals;
   an $\frac{M}{L}$-point inverse discrete fourier transform for calculating IDFT coefficients for the plurality of selected, regularly spaced channels from the second sequence of signals; and
   a combiner for combining the IDFT coefficients with a carrier signal sequence to provide the plurality of selected, regularly spaced channels;
   an output for outputting the selected, regularly spaced channels.

6. The channelizer of claim 5 wherein the first sequence of signals includes each channel within the wideband signal.

7. The channelizer of claim 5 wherein the second sequence of signals includes only a number of signals equal to the plurality of selected, regularly spaced channels.

8. The channelizer of claim 5 wherein the subsampled DFT-channelizer can extract any first channel from the wideband signal as one of the plurality of selected, regularly spaced channels.

9. A method for processing a wideband signal including a plurality of regularly spaced channels, comprising the steps of:
   receiving the wideband signal including the plurality of channels;
   filtering the wideband signal to extract a first sequence of signals within the wideband signal;
   time aliasing the a first sequence of signals to obtain a second sequence of signals;
   processing the second sequence of signals according to an $\frac{M}{L}$-point inverse discrete fourier transform to obtain IDFT coefficients of the plurality of regularly spaced channels; and
   mixing the IDFT coefficients with a carrier signal sequence to obtain a selected number of regularly spaced channels;
   outputting the selected number of regularly spaced channels.

10. A method for processing a wideband signal including a plurality of regularly spaced channels, comprising the steps of:

receiving the wideband signal including the plurality of channels;

filtering the wideband signal to extract each of the plurality of regularly spaced channels;

determining IDFT coefficients for a selected number of regularly spaced channels from the extracted plurality of channels; and mixing the IDFT coefficients with a carrier signal sequence to obtain the selected number of regularly spaced channels.

outputting the selected number of regularly spaced channels.

* * * * *

UNITED STATES PATENT AND TRADEMARK OFFICE
CERTIFICATE OF CORRECTION

PATENT NO : 6,005,900
DATED : December 21, 1999
INVENTOR(S): Kambiz C. Zangi

It is certified that error appears in the above-identified patent and that said Letters Patent are hereby corrected as shown below:

Column 3, line 51   After "and"
                    Insert --the--
Column 4, line 59   Before "M/L-point"
                    Insert --An--
Column 7, line 5    Replace "a selected"
                    With --the selected--

Signed and Sealed this

Twenty-second Day of May, 2001

Attest:

NICHOLAS P. GODICI

*Attesting Officer*   Acting Director of the United States Patent and Trademark Office